(12) United States Patent
Wang et al.

(10) Patent No.: US 11,143,905 B2
(45) Date of Patent: Oct. 12, 2021

(54) DISPLAY PANEL AND MANUFACTURING METHOD THEREOF, DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Linlin Wang, Beijing (CN); Huabin Chen, Beijing (CN); Yongzhi Song, Beijing (CN)

(73) Assignees: BEIJING BOE DISPLAY TECHNOLOGY CO., LTD., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 16/630,939

(22) PCT Filed: Jun. 3, 2019

(86) PCT No.: PCT/CN2019/089833
§ 371 (c)(1),
(2) Date: Jan. 14, 2020

(87) PCT Pub. No.: WO2020/042701
PCT Pub. Date: Mar. 5, 2020

(65) Prior Publication Data
US 2021/0063811 A1 Mar. 4, 2021

(30) Foreign Application Priority Data
Aug. 28, 2018 (CN) .......................... 201810987020.0

(51) Int. Cl.
*G02F 1/1335* (2006.01)
*G02B 3/00* (2006.01)
(Continued)

(52) U.S. Cl.
CPC ..... *G02F 1/133526* (2013.01); *G02B 3/0006* (2013.01); *G02B 3/08* (2013.01);
(Continued)

(58) Field of Classification Search
None
See application file for complete search history.

(56) References Cited

U.S. PATENT DOCUMENTS

2008/0252821 A1* 10/2008 Liao .................. G02F 1/133377
349/86
2008/0252831 A1* 10/2008 Lee .................... G02F 1/133514
349/106
(Continued)

FOREIGN PATENT DOCUMENTS

CN 101285959 10/2008
CN 104900683 9/2015
(Continued)

OTHER PUBLICATIONS

Chinese Office Action dated Aug. 5, 2020 corresponding to Chinese Patent Application No. 201810987020.0; 22 pages.

*Primary Examiner* — Ashok Patel
(74) *Attorney, Agent, or Firm* — Leason Ellis LLP

(57) ABSTRACT

A display panel and a manufacturing method thereof, and a display device are disclosed. The display panel includes a display laminated structure and an electrostatic discharge layer stacked on a surface, which is at a display side of the display laminated structure, of the display laminated structure. The display laminated structure includes a display region, the electrostatic discharge layer includes a lens unit, and the lens unit is on the display region.

20 Claims, 8 Drawing Sheets

(51) Int. Cl.
*G02B 3/08* (2006.01)
*G02F 1/1333* (2006.01)
*H01L 27/32* (2006.01)
*H01L 51/52* (2006.01)

(52) U.S. Cl.
CPC .. *G02F 1/133382* (2013.01); *G02F 1/133528* (2013.01); *H01L 27/3272* (2013.01); *H01L 51/5275* (2013.01); *H01L 51/5281* (2013.01); *G02F 1/133357* (2021.01); *G02F 2202/22* (2013.01)

(56) References Cited

U.S. PATENT DOCUMENTS

2013/0141552 A1\* 6/2013 Kwon .................... H04N 13/30
                                                                         348/54
2017/0285223 A1\* 10/2017 Zhou ........................ G02B 3/08
2019/0035935 A1\* 1/2019 Nakazawa .......... H01L 27/1207

FOREIGN PATENT DOCUMENTS

| CN | 107272250 | 10/2017 |
|----|-----------|---------|
| CN | 107357130 | 11/2017 |
| KR | 1020060036676 | 5/2006 |

\* cited by examiner

DISPLAY PANEL AND MANUFACTURING METHOD THEREOF, DISPLAY DEVICE

CROSS-REFERENCE TO RELATED PATENT APPLICATIONS

This application is a U.S. National Stage Application under 35 U.S.C. § 371 of International Patent Application No. PCT/CN2019/089833, filed Jun. 3, 2019, which claims priority to the Chinese patent application No. 201810987020.0, filed on Aug. 28, 2018, the entire disclosures of which are incorporated herein by reference in their entireties as part of the present application.

TECHNICAL FIELD

Embodiments of the present disclosure relate to a display panel and a manufacturing method thereof and a display device.

BACKGROUND

With the development of display technology, display devices such as virtual reality (VR) display devices and augmented reality (AR) display devices have been widely recognized by users and received widely attentions from the industry. Virtual reality devices have advantages such as immersion, interaction, imagination, and so on; augmented reality display systems can realize fusion of an external real-world scene and a virtual scene through superposition of a displayed virtual scene image and the external real-world scene, such that a cognitive ability of a user to the real world can be improved.

SUMMARY

At least one embodiment of the present disclosure provides a display panel and a display device. The display panel comprises a display laminated structure and an electrostatic discharge layer stacked on a surface, which is at a display side of the display laminated structure, of the display laminated structure. The display laminated structure comprises a display region, the electrostatic discharge layer comprises a lens unit, and the lens unit is on the display region.

At least one embodiment of the present disclosure further provides a display device which comprises a display panel provided by any one of the embodiments of the present disclosure.

At least one embodiment of the present disclosure further provides a manufacturing method of the display panel, and the method comprises: providing a display laminated structure; and forming an electrostatic discharge layer on a surface, which is at a display side of the display laminated structure, of the display laminated structure. The display laminated structure comprises a display region, the electrostatic discharge layer comprises a lens unit, and the lens unit is on the display region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

Figure 1:
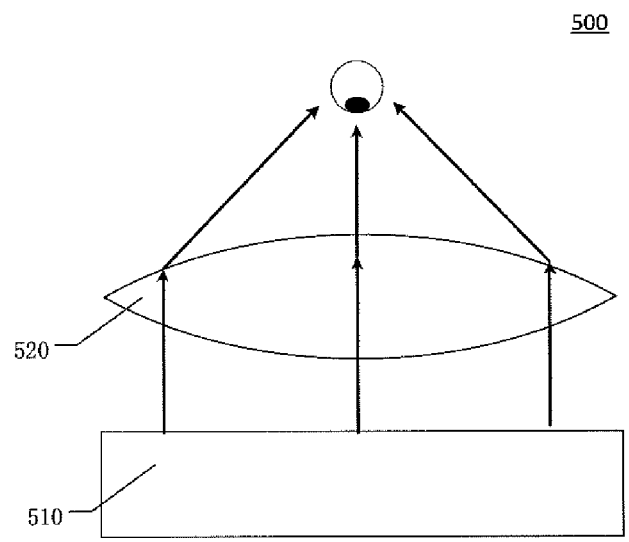
FIG. 1 is a cross-sectional view of a display panel.

FIG. 1 is a cross-sectional view of a display panel, and the display panel, for example, can be applied in virtual reality glasses and augmented reality glasses. As illustrated in FIG. 1, the display panel includes a display laminated structure 510 and a lens layer 520, the lens layer 520 is spaced apart from the display laminated structure 510, for example. The lens layer 520 includes, for example, an array of micro-lenses, each micro-lens is implemented as, for example, a biconvex lens or a plano-convex lens. The lens layer 520 enables a user's eyes to better see an image displayed by the display laminated structure 510 at a position which is relatively close to the display panel by converging light emitted by the display laminated structure 510 (or imaging an image displayed by the display laminated structure 510), thereby enabling the display panel to realize near-eye display, such that the display panel can be applied in smart glasses such as virtual reality glasses, augmented reality glasses, and the like. However, the inventors of the present disclosure have noticed in research that the lens layer 520 which is separately provided with respect to the display laminated structure 510 is relatively thick, thereby increasing the thickness and the weight of the display device including the display panel (e.g., virtual reality glasses and augmented reality glasses).

At least one embodiment of the present disclosure provides a display panel and a display device. The display panel comprises a display laminated structure and an electrostatic discharge layer stacked on a surface, which is at a display side of the display laminated structure, of the display laminated structure. The display laminated structure comprises a display region, the electrostatic discharge layer comprises a lens unit, and the lens unit is on the display region. In some embodiments, the electrostatic discharge layer includes the lens unit, which enables the display panel and the display device to have an electrostatic discharge effect and a light converging effect without providing a separate lens layer, thereby reducing the thickness and the weight of a display device (e.g., virtual reality glasses and augmented reality glasses) including the display panel.

In some examples, the description that the lens unit of the electrostatic discharge layer has a light converging effect means that the lens unit can allow light that is originated from the display laminated structure and incident onto the lens unit to have a smaller divergence angle when the light exits from the lens unit, without requiring the light exiting from the lens unit to be convergent light. For example, in the case where the light exiting from the lens unit is divergent light or divergent light close to parallel light, an image observed by the user of the display panel is a virtual image; for example, in the case where the light exiting from the lens unit is convergent light, the image observed by the user of the display panel is a real image. It should be noted that the display panel and the display device provided in at least one embodiment of the present disclosure can provide virtual images or real images according to actual application requirements, and no further description will be given here.

Non-limitative descriptions are given to the display panel provided by the embodiments of the present disclosure in the following with reference to a plurality of examples. As described in the following, in case of no conflict, different features in these specific examples may be combined so as to obtain new examples, and the new examples are also fall within the scope of present disclosure.

Figure 2:
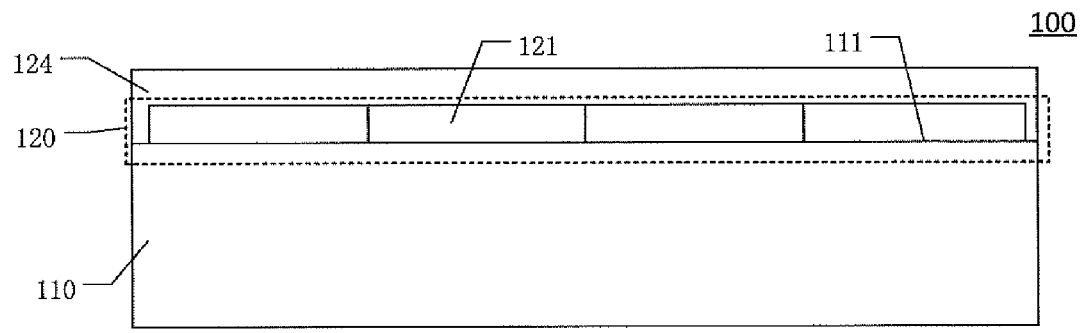
FIG. 2 is a cross-sectional view of a display panel provided by at least one embodiment of the present disclosure.

FIG. 2 is a cross-sectional view of a display panel 100 provided by at least one embodiment of the present disclosure, and the display panel can be applied in near-eye display devices or head-mounted display devices such as virtual reality display devices, augmented reality display devices, and the like.

As illustrated in FIG. 2, the display panel 100 includes a display laminated structure 110 and an electrostatic discharge layer 120 stacked on a surface 111, which is at a display side of the display laminated structure 110, of the display laminated structure 110. For example, the electrostatic discharge layer 120 is made of a transparent conductive material, and for example, the electrostatic discharge layer 120 is grounded to release static electricity generated during processes, such as operation and transportation of the display panel, so as to provide a protection (e.g., an electrostatic protection function) for the display panel. In some examples, the transparent conductive material includes graphene, thereby improving a conductive performance and a light transmission performance of the electrostatic discharge layer 120; in some other examples, the transparent conductive material of the electrostatic discharge layer 120 includes at least one material selected from a group consisting of indium tin oxide (ITO), indium zinc oxide (IZO), cadmium tin oxide (CTO), tin oxide ($SnO_2$), zinc oxide, ZnO), and the like.

For example, because the display laminated structure 110 is in direct contact with the electrostatic discharge layer 120, the electrostatic discharge layer 120 can lead the accumulated electrostatic charge on the display laminated structure 110 out of the display laminated structure 110 in time, such that adverse influence of the accumulated electrostatic charge on the display laminated structure 110 can be avoided.

Figure 3A:
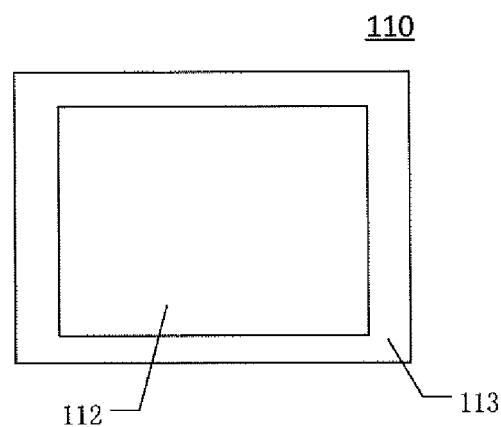
FIG. 3A is a plan view of a display laminated structure provided by at least one embodiment of the present disclosure.
Figure 3B:
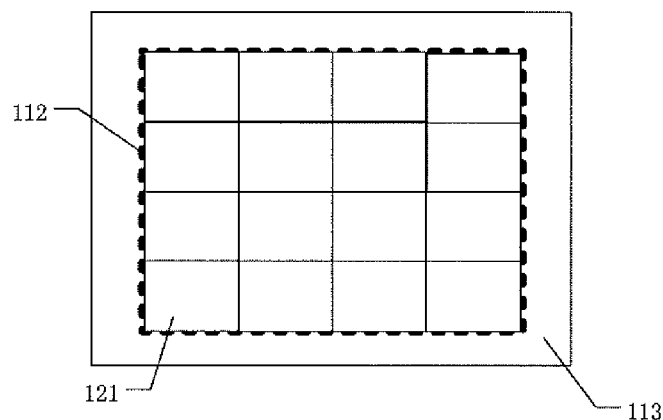
FIG. 3B is a plan view of a display panel provided by at least one embodiment of the present disclosure.

As illustrated in FIG. 3A, the display laminated structure 110 includes a display region 112 and a peripheral region 113 surrounding the display region 112. As illustrated in FIG. 3A and FIG. 3B, the electrostatic discharge layer 120 includes a lens unit 121, and the lens unit 121 is on the display region 112. For example, the orthographic projection of the lens unit 121 on the display laminated structure 110 overlaps (e.g., completely overlaps) the display region 112. For example, the lens unit 121 included in the electrostatic discharge layer 120 can converge light emitted by the display region 112 of the display laminated structure 110, and enable the user's eyes to better see an image displayed by the display laminated structure 110 at a position which is relatively close to the display panel. Compared with the display panel as illustrated in FIG. 1, because the display panel 100 provided by an embodiment of the present disclosure is not required to provide a lens layer which is separately provided with respect to the display laminated structure 110, the thickness and the weight of the display device (e.g., virtual reality glasses and augmented reality glasses) including the display panel can be reduced, thereby improving the user experience.

For example, specific type and specific structure of the lens unit 121 may be set according to actual application requirements, and no limitation will be given in embodiments of the present disclosure in this respect.

For example, as illustrated in FIG. 4a to FIG. 4F, the lens unit 121 may be implemented as a Fresnel lens unit, such that the thickness of the lens unit 121 is reduced, and the thickness and the weight of the display panel 100 are further reduced. Specific structure and specific parameters of the Fresnel lens unit may be set according to actual application requirements, and no limitation will be given in embodiments of the present disclosure in this respect.

Figure 4A:
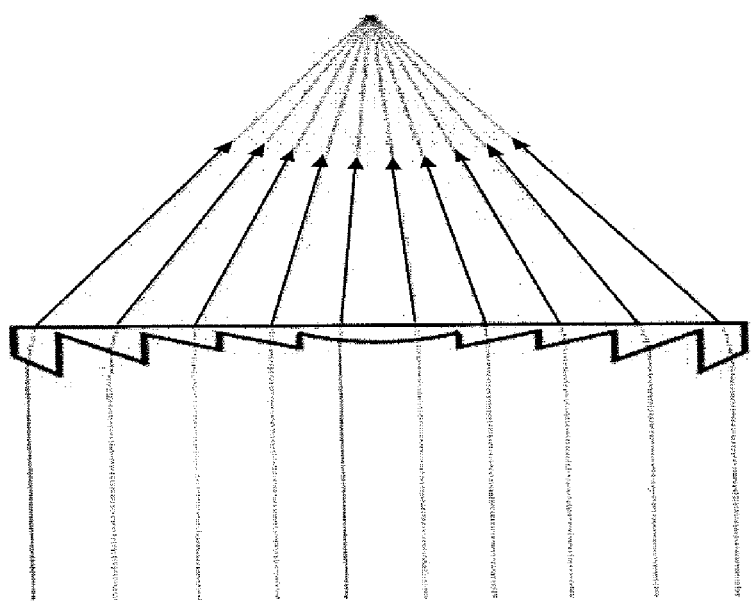
FIG. 4A is a cross-sectional view of a Fresnel lens provided by at least one embodiment of the present disclosure.

For example, the Fresnel lens unit may be implemented as a Fresnel lens as illustrated in FIG. 4A or an appropriate variation thereof. As illustrated in FIG. 4A, the surface of the Fresnel lens unit includes an arc surface (ellipsoidal arc surface) located in a center portion and serrated grooves located in a peripheral region; for example, the widths of the grooves (the widths in the direction along which the grooves are arranged) are the same; for example, the angle of each of the grooves is different from the angle of an adjacent groove, and the angle of the groove refers to an included angle between two surfaces forming the groove.

As illustrated in FIG. 4A, the Fresnel lens unit included in the electrostatic discharge layer 120 can converge light that is incident on the Fresnel lens unit (e.g., substantially parallel light that is incident on the Fresnel lens unit or light having a small divergence angle), thus enabling the user's eyes to better see the image displayed by the display laminated structure 110 at a position which is relatively close to the display panel. Compared with the display panel as illustrated in FIG. 1, because the display panel 100 provided by an embodiment of the present disclosure is not required to provide a lens layer which is separately provided with respect to the display laminated structure 110, the thickness and the weight of the display panel 100 are reduced, thereby improving the user experience.

Figure 4B:
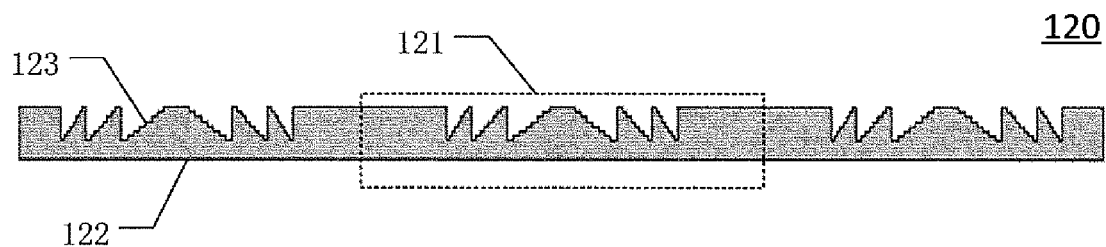
FIG. 4B is a cross-sectional view of another Fresnel lens provided by at least one embodiment of the present disclosure.
Figure 4C:
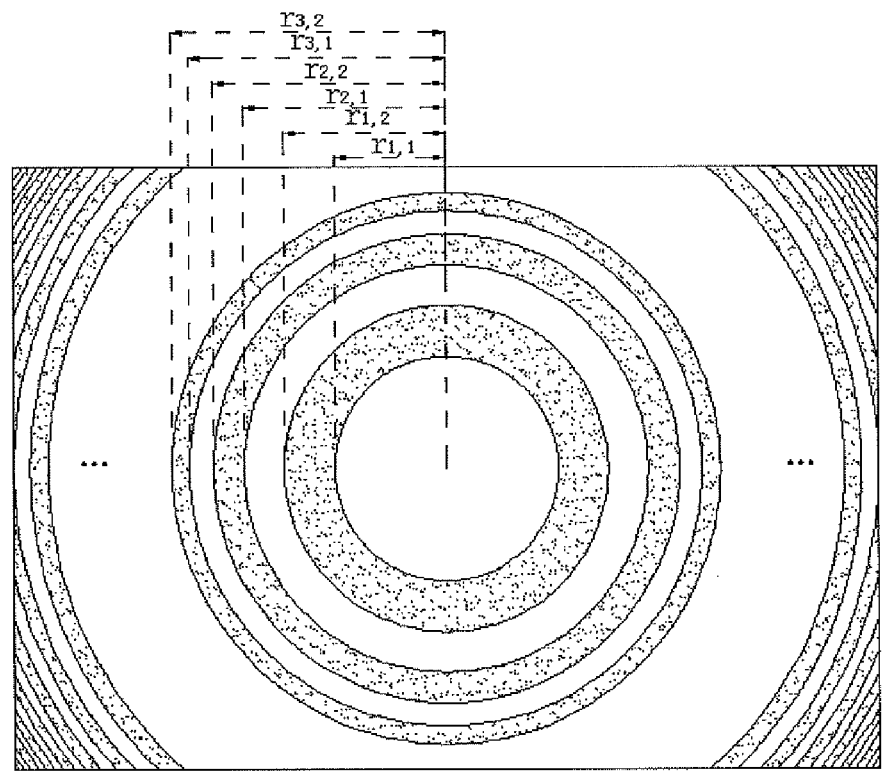
FIG. 4C is a cross-sectional view of further another Fresnel lens provided by at least one embodiment of the present disclosure.
Figure 4D:
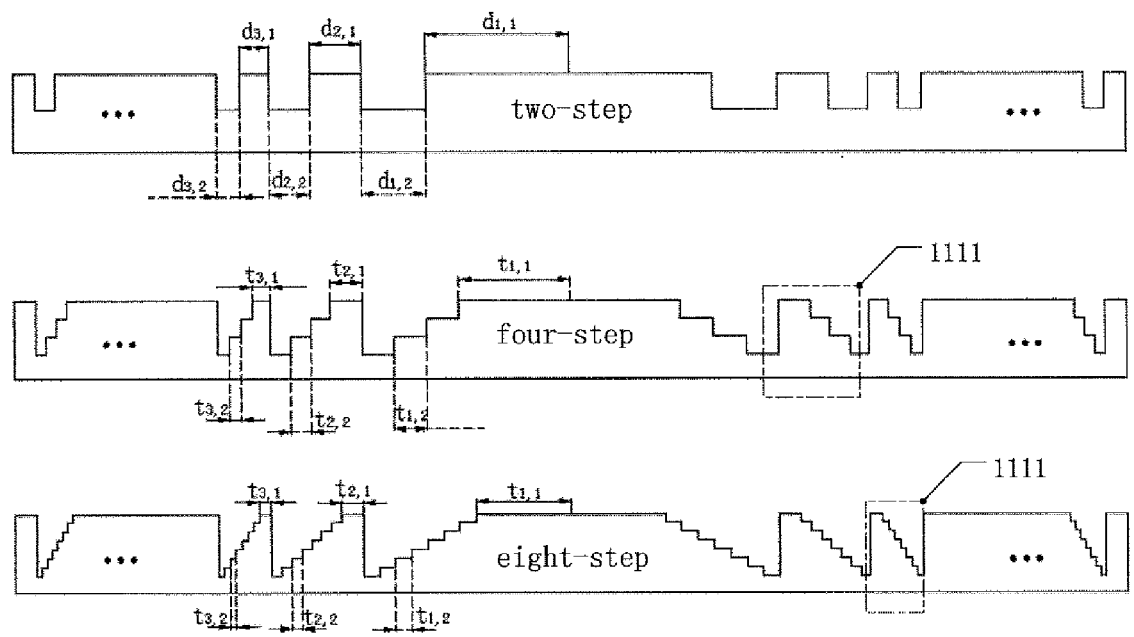
FIG. 4D is a cross-sectional view of still another Fresnel lens provided by at least one embodiment of the present disclosure.

For example, according to actual application requirements, as illustrated in FIG. 4B-FIG. 4D, the Fresnel lens unit may also be implemented as a phase Fresnel lens, thereby reducing manufacturing difficulty of the Fresnel lens unit. For example, the phase Fresnel lens is a two-step (two-level) Fresnel lens, a four-step (four-level) Fresnel lens, an eight-step (eight-level) Fresnel lens, a sixteen-step (sixteen-level) Fresnel lens or other suitable Fresnel lens. For example, FIG. 4C illustrates a plan view of a two-step Fresnel lens, and FIG. 4D illustrates cross-sectional views of a two-step Fresnel lens, a four-step Fresnel lens, and an eight-step Fresnel lens. It should be noted that the step distribution as illustrated in FIG. 4D represents the phase distribution of the Fresnel lens.

For example, as illustrated in FIG. 4B-FIG. 4D, the Fresnel lens includes M grating units 1111 (e.g., phase grating units), M is a positive integer (the specific value of M may be set based on the size of the Fresnel lens), each of the grating units 1111 may include $N=2^m$ ($m=1, 2, 3, \ldots$) steps, and the values of m are respectively equal to 1, 2, and 3 for the two-step Fresnel lens, the four-step Fresnel lens, and the eight-step Fresnel lens. For example, the phase change (e.g., a phase difference between regions, where adjacent steps are located, of the Fresnel lens), which is caused by each step to light that is incident the each step, of the light that is incident the each step is $2\pi/N$, and the step height is $h=\lambda/(N\times(n1-n2))$; here, $\lambda$ is a wavelength of the light that is incident on the Fresnel lens (in the case where the incident light is white polychromatic light, the value of $\lambda$ may be 587 nm, for example), n1 is the refractive index of the Fresnel lens (for example, n1=1.4918), and n2 is the refractive index of a medium surrounding the Fresnel lens (for example, n2=1).

For example, as illustrated in FIG. 4C, for a two-step phase Fresnel lens, rj,1 (that is, $r_{j,1}$) and rj,2 (that is, $r_{j,2}$) are respectively radii of annuluses of the j-th grating unit 1111, in which j is a positive integer less than or equal to M. For example, rj,1, rj,2, the focal length value f' of the two-step phase Fresnel lens, the refractive index n of the medium in the object space and the image space of the two-step phase Fresnel lens, and the wavelength of the incident light satisfy the following relationship:

$$r_{j,1} = \left[\left(f' + \frac{(2j-1)\lambda/2}{n}\right)^2 - f'^2\right]^{1/2} = \sqrt{\frac{(2j-1)f'\lambda}{n}}\left(1 - \frac{(2j-1)\lambda}{4nf'}\right)^{1/2}$$

$$r_{j,2} = \left[\left(f' + \frac{j\lambda}{n}\right)^2 - f'^2\right]^{1/2} = \sqrt{\frac{2jf'\lambda}{n}}\left(1 - \frac{j\lambda}{2nf'}\right)^{1/2}.$$

The step widths dj,1 (that is, $d_{j,1}$) and dj,2 (that is, $d_{j,2}$) of the two-step Fresnel lens respectively satisfy the following formulas:

$$d_{j,1} = r_{j,1} - r_{j-1,2}$$

$$d_{j,2} = r_{j,2} - r_{j,1}.$$

For example, as illustrated in FIG. 4D, for an N-step (N-level) phase Fresnel lens, each of the grating units 1111 includes N−1 steps (levels) having the same width (the N−1 steps having the same width are in sequence and adjacent steps of the N−1 steps are connected); one remaining step (in the central region of the phase Fresnel lens) of the N steps has a width different from the width of the above-mentioned N−1 steps, and the width tj,2 (i.e., $t_{j,2}$) of the N−1 steps in the j-th grating unit and the width tj,1 (i.e., $t_{j,1}$) of the remaining step in the j-th grating unit respectively satisfy the following formulas:

$$t_{j,2} = \frac{d_{j,2}}{N/2}$$

$$t_{j,1} = d_{j,1} - \sum_{i=1}^{m-1} \frac{d_{j,2}}{2^i}.$$

For example, for the eight-step Fresnel lens, the width t1,2 of seven steps, which have same one width, in the first grating unit, the width t1,1 of one remaining step in the first grating unit, and the width t2,2 of seven steps, which have same one width, in the second grating elements, the width t2,1 of one remaining step in the second grating elements, the width t3,2 of seven steps, which have same one width, in the third grating unit 1111, and the width t3,1 of one remaining step in the third grating unit 1111 respectively satisfy the following formulas:

$$t_{1,2} = \frac{d_{1,2}}{4},$$

$$t_{1,1} = d_{1,1} - \frac{d_{1,2}}{2} - \frac{d_{1,2}}{4},$$

$$t_{2,2} = \frac{d_{2,2}}{4},$$

-continued $$t_{2,1} = d_{2,1} - \frac{d_{2,2}}{2} - \frac{d_{2,2}}{4},$$

$$t_{3,2} = \frac{d_{3,2}}{4},$$

$$t_{3,1} = d_{3,1} - \frac{d_{3,2}}{2} - \frac{d_{3,2}}{4}.$$

The Fresnel lens units as illustrated in FIG. 4B-FIG. 4D can converge light (e.g., substantially parallel light or light having a small divergence angle) incident on the Fresnel lens units, and thus enable the user's eye to see the image displayed by the display laminated structure 110. Compared with the display panel as illustrated in FIG. 1, because the display panel 100 provided by an embodiment of the present disclosure is not required to provide a lens layer which is separately provided with respect to the display laminated structure 110, the thickness and the weight of the display panel 100 can be reduced, thereby improving the user experience.

Figure 4E:
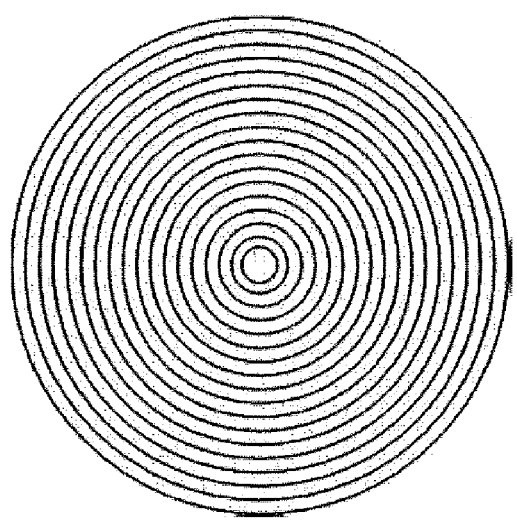
FIG. 4E is a cross-sectional view of still another Fresnel lens provided by at least one embodiment of the present disclosure.
Figure 4F:
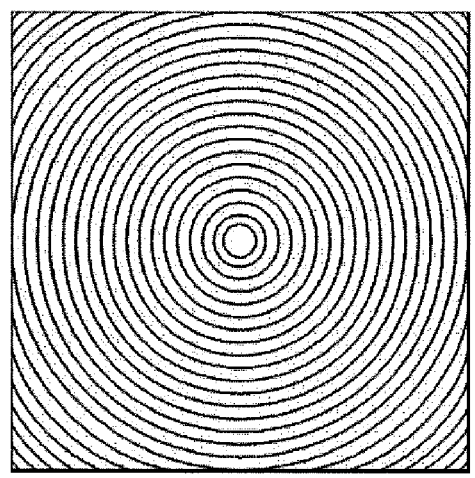
FIG. 4F is a cross-sectional view of still another Fresnel lens provided by at least one embodiment of the present disclosure.

It should be noted that according to actual application requirements, the Fresnel lens unit may also be implemented as the Fresnel lens as illustrated in FIG. 4E or FIG. 4F, and no further description will be given here.

For example, according to actual application requirements, the lens unit 121 provided by an embodiment of the present disclosure may also be implemented as a micro-nano lens based on the super-surface phase adjustment principle or a micro-lens based on a holographic material. It should be noted that the lens unit 121 provided by an embodiment of the present disclosure is not limited to being implemented as a Fresnel lens unit, a micro-nano lens based on the super-surface phase adjustment principle, or a micro-lens based on a holographic material. The lens unit 121 provided by an embodiment of the present disclosure may also be implemented as other suitable lenses, as long as the lens unit 121 is made of a transparent conductive material, and no further description will be given here.

Figure 5A:
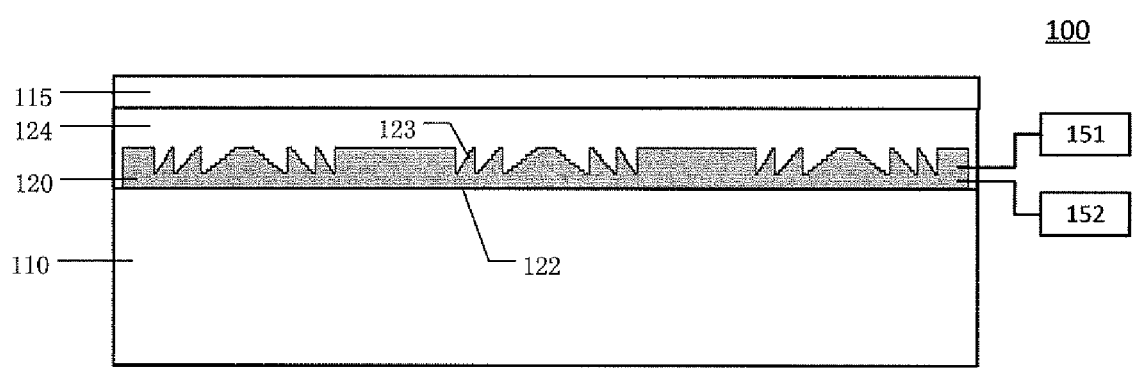
FIG. 5A is a cross-sectional view of another display panel provided by at least one embodiment of the present disclosure.

As illustrated in FIG. 5A, the lens unit 121 comprises a flat surface 122 and a non-flat surface 123 (step surfaces as illustrated in FIG. 4B and FIG. 4D) opposite to the flat surface 122. And the non-flat surface 123 is further away from the display laminated structure 110 than the flat surface 122. For example, in some examples, the non-flat surface 123 is closer to the display laminated structure 110 than the flat surface 122, and no further description will be given here.

Figure 5B:
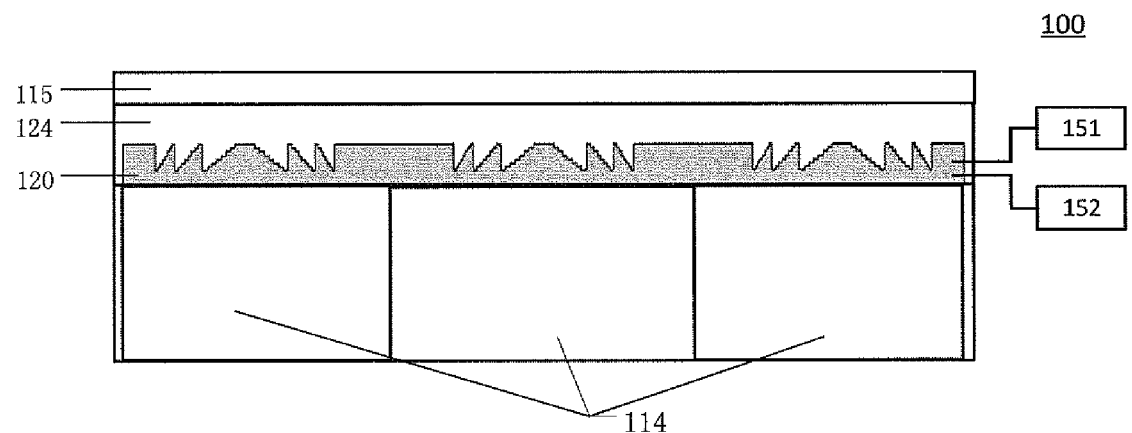
FIG. 5B is a cross-sectional view of further another display panel provided by at least one embodiment of the present disclosure.

As illustrated in FIG. 5A and FIG. 5B, in some examples, the display panel 100 further includes a planarization layer 124; the planarization layer 124 covers the non-flat surface 123 to planarize the surface of the electrostatic discharge layer 120 on the side where the non-flat surface 123 is provided, thereby enabling other layers to be better attached to the electrostatic discharge layer 120. For example, the refractive index of the planarization layer 124 is smaller than the refractive index of the lens unit 121 to prevent the planarization layer 124 from affecting the performance of the lens unit 121.

Figure 6:
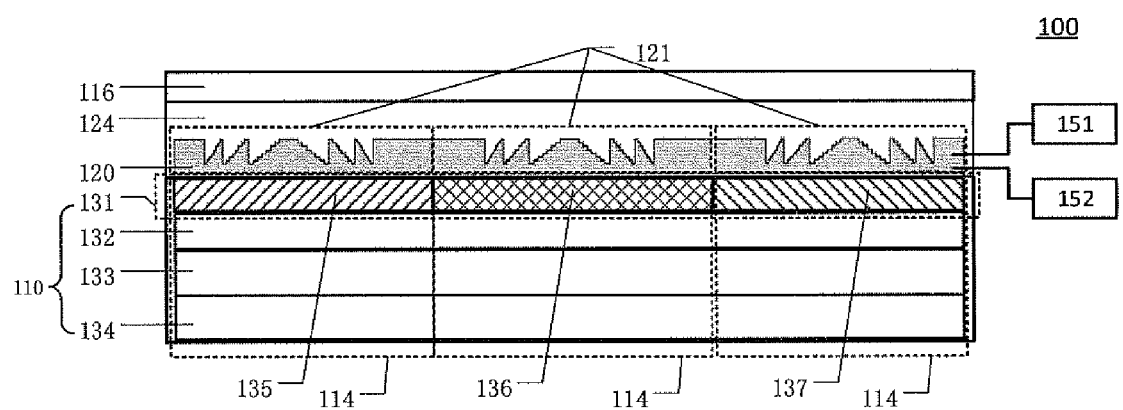
FIG. 6 is a cross-sectional view of still another display panel provided by at least one embodiment of the present disclosure.

For example, as illustrated in FIG. 6, the display laminated structure 110 may be configured as a liquid crystal display laminated structure; in this case, the display laminated structure 110 includes a backlight 134, an array substrate 133, a liquid crystal layer 132, and a color filter substrate 131 sequentially arranged. The color filter substrate 131 includes a first color filter unit 135, a second color filter unit 136 and a third color filter unit 137. Colors of the first color filter unit 135, the second color filter unit 136 and the third color filter unit 137 are different from each other (e.g., red filter, green filter and blue filter, respectively). For example, specific structures of the backlight 134, the array substrate 133, the liquid crystal layer 132 and the color filter substrate 131 can refer to related technologies, and no further description will be given here. It should be noted that, in some embodiments, the array substrate and the color filter substrate may be integrated into one substrate and disposed on one side of the liquid crystal layer; in this case, the display laminated structure 110 as illustrated in FIG. 6 can be adaptively modified, which is not described in detail here.

As illustrated in FIG. 6, in some examples, the display panel 100 further includes a first polarizer 116 and a second polarizer (not illustrated in FIG. 6). As illustrated in FIG. 6, the first polarizer 116 is attached to the side of the electrostatic discharge layer 120 away from the display laminated structure 110. For example, the first polarizer 116 is attached to the surface of the planarization layer 124 away from the display laminated structure 110. The second polarizer is disposed between the backlight 134 and the array substrate 133. For example, the first polarizer 116 and the second polarizer are implemented as linear polarizers, and are configured to cooperate with the liquid crystal layer 132 to control the intensity of light output by the display panel 100.

For example, according to actual application requirements, the display laminated structure 110 may also be configured as a self-luminous display laminated structure, and the self-luminous display laminated structure may be implemented as an organic light emitting diode display laminated structure or a quantum dot display laminated structure.

Figure 8:
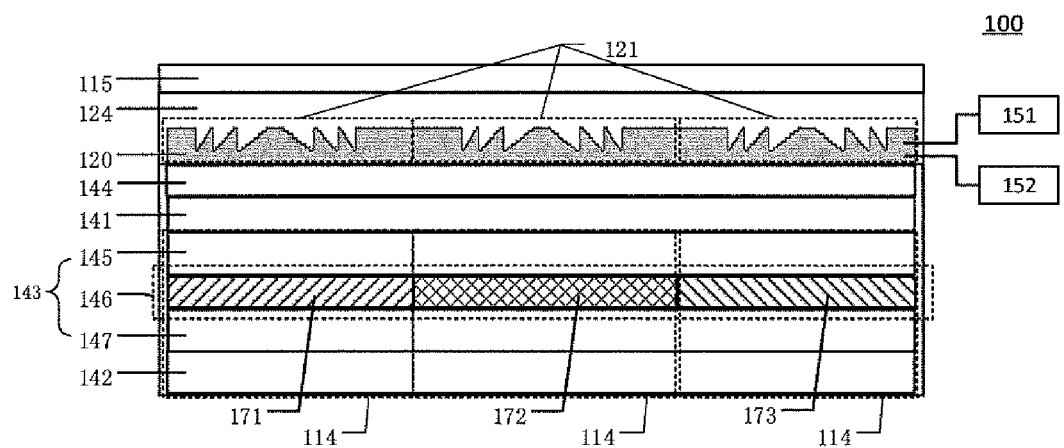
FIG. 8 is a cross-sectional view of still another display panel provided by at least one embodiment of the present disclosure.

FIG. 8 is a cross-sectional view of a display panel including a self-luminous display laminated structure provided by at least one embodiment of the present disclosure. For example, as illustrated in FIG. 8, the display laminated structure 110 (self-luminous display laminated structure) includes a second electrode 142, a function layer 143, a first electrode 141, and a protective substrate 144. The second electrode 142 is, for example, a cathode (including metal, for example), and the first electrode 141 is, for example, an anode. The function layer 143 includes a light emitting layer 146 (an organic light emitting layer or a quantum dot light emitting layer), and the light emitting layer 146 includes a first light emitting unit 171, a second light emitting unit 172, and a third light emitting unit 173. In some examples, the colors of light 161 emitted by the first light emitting unit 171, the second light emitting unit 172 and the third light emitting unit 173 are different from each other; in some other examples, all the colors of the light 161 emitted by the first light emitting unit 171, the second light emitting unit 172 and the third light emitting unit 173 are the same. In this case, color display of the display laminated structure 110 can be realized by arranging filters of different colors on the light emitting side of the function layer 143. In some examples, the function layer 143 may further include a hole transport layer 145, an electron transport layer 147, and the like.

For example, the protective substrate 144 may be a glass substrate, a quartz substrate, a plastic substrate such as a polyethylene terephthalate (PET) substrate, or a substrate made of other suitable materials. For example, as illustrated in FIG. 4B and FIG. 8, in the case where the display laminated structure 110 is configured as the self-luminous display laminated structure, the electrostatic discharge layer 120 and the lens unit 121 included in the electrostatic discharge layer 120 are stacked on the surface 111, which is at a display side of the display laminated structure 110, of the display laminated structure 110 via the flat surface 122 and the protective substrate 144.

As illustrated in FIG. 8, in some examples, the display panel 100 further includes a polarizer 115; in addition, the polarizer 115 is attached to the side of the electrostatic discharge layer 120 away from the display laminated structure 110. For example, the polarizer 115 is implemented as a circular polarizer to reduce intensity of reflected light caused by reflection of the display laminated structure 110, and thereby reducing adverse effects of the reflected light on quality of images displayed by the display laminated structure 110. As illustrated in FIG. 8, the polarizer 115 is attached to the surface of the planarization layer 124 on the side away from the display laminated structure 110, but embodiments of the present disclosure are not limited to this case.

For example, as illustrated in FIG. 5B, FIG. 6 and FIG. 8, the electrostatic discharge layer 120 includes a plurality of lens units 121, and for example, the plurality of lens units 121 are arranged in an array; the display laminated structure 110 (e.g., the display region 112 of the display laminated structure 110) includes a plurality of display sub-pixels 114 (a plurality of display sub-pixels 114 arranged in an array), and the plurality of display sub-pixels 114 and the plurality of lens units 121 are in one-to-one correspondence, such that the quality of an image observed by the user's eyes is improved. For example, orthographic projections of the plurality of lens units 121 on the display laminated structure 110 respectively overlaps (e.g., completely overlaps) the plurality of display sub-pixels 114. For example, as illustrated in FIG. 6, the first color filter unit 135, the second color filter unit 136 and the third color filter unit 137 respectively correspond to one display sub-pixel 114 (respectively disposed in one corresponding display sub-pixel 114), and each of the display sub-pixels 114 corresponds to one lens unit 121; for example, the orthographic projection of each of the display sub-pixels 114 on the electrostatic discharge layer 120 coincides (e.g., completely coincides) with a corresponding lens unit 121. For another example, as illustrated in FIG. 8, the first light emitting unit 171, the second light emitting unit 172, and the third light emitting unit 173 respectively corresponding to one display sub-pixel 114 (the first light emitting unit 171, the second light emitting unit 172 are respectively disposed in one corresponding display sub-pixel 114), and each of the display sub-pixels 114 corresponds to one lens unit 121.

It should be noted that the display panel 100 provided by an embodiment of the present disclosure is not limited to the case that the display sub-pixels 114 and the lens units 121 are in one-to-one correspondence; according to actual application requirements, each of the lens unit 121 may also correspond to a first number of lens units 121, in which the first number is smaller than the number of lens units 121 included in the electrostatic discharge layer 120 and larger than one, thereby reducing the number of Fresnel lens units and reducing the manufacturing difficulty of the electrostatic discharge layer 120. For example, the electrostatic discharge layer 120 may be provided with only one lens unit 121 (e.g., a phase Fresnel lens unit), and the lens unit 121 corresponds to all the display sub-pixels 114 of the display laminated structure 110.

It should be noted that in the case where the electrostatic discharge layer 120 includes a plurality of lens units 121, the plurality of lens units 121 are electrically connected to each other (for example, adjacent lens units 121 are in contact with each other but do not overlap with each other), thereby ensuring that the electrostatic discharge layer 120 can conduct electrostatic charges accumulated on the display laminated structure out of the display panel.

Figure 7:
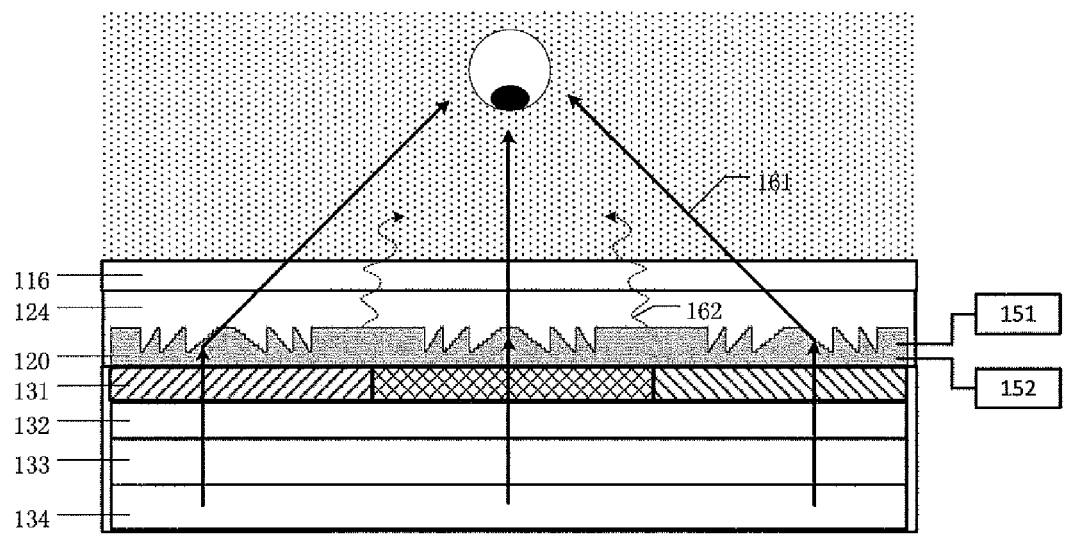
FIG. 7 is a diagram illustrating an exemplary application scenario of the display panel as illustrated in FIG. 6.
Figure 9:
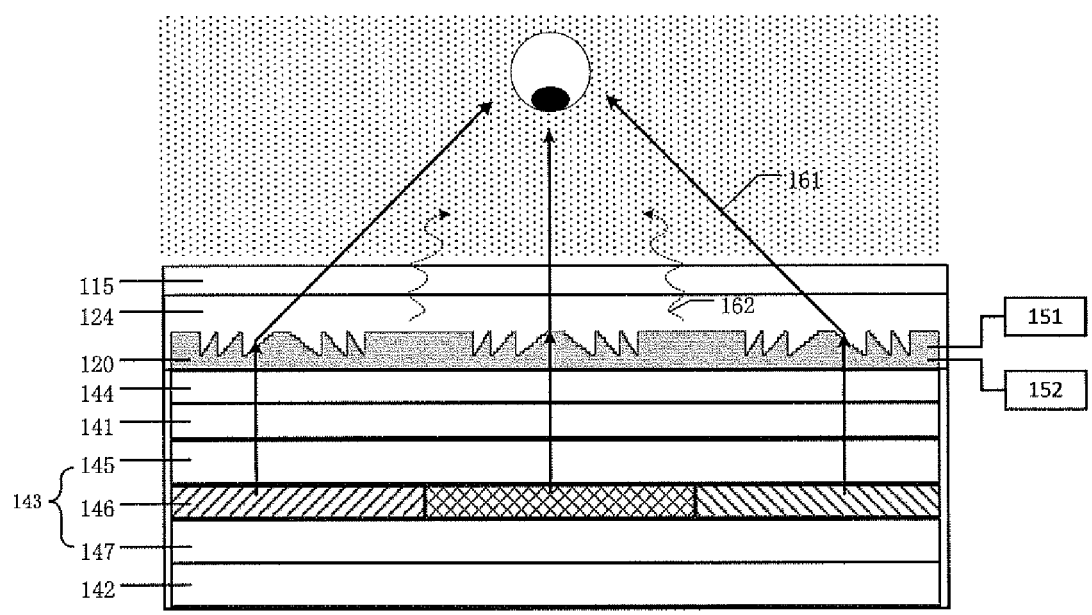
FIG. 9 is a diagram illustrating an exemplary application scenario of the display panel as illustrated in FIG. 8.

As illustrated in FIG. 7 and FIG. 9, in some examples, the display panel 100 further includes a voltage control circuit 151, and the voltage control circuit 151 is connected to the electrostatic discharge layer 120 and is configured to apply a voltage (e.g., 1 V-10 V) to the electrostatic discharge layer 120, so that static charges accumulated on the electrostatic discharge layer 120 can be better guided out of the display panel 100. For example, the voltage control circuit may adopt a variable voltage-dividing circuit connected to a system voltage supply, and output a control voltage to the electrostatic discharge layer by adjusting divided voltages.

For example, in the case where the electrostatic discharge layer 120 includes graphene and a voltage is applied to the electrostatic discharge layer 120, carbon molecules of graphene in the electrostatic discharge layer 120 generate phonons, ions, and electrons; the generated phonons, ions, and electrons rub and collide (e.g., Brownian motion) with carbon molecular clusters, such that thermal energy which can be converted into far infrared rays 162 can be generated, and the far infrared rays 162 are radiated out (e.g., uniformly radiated out) from the electrostatic discharge layer 120. For example, the electrostatic discharge layer 120 may radiate far infrared rays 162 within the wavelength range of 5 microns to 14 microns (e.g., 9 microns to 12 microns). For example, because the wavelength of the far infrared rays 162 radiated by the electrostatic discharge layer 120 is close to (e.g., substantially the same as) the wavelength of the infrared ray radiated by the human body, the far infrared rays 162 radiated by the electrostatic discharge layer 120 can resonate with cells of the human body, thus promoting eye blood circulation, activating eye cells, enhancing oxygen supply for eyes, restoring ciliary muscle elasticity, promoting oxygen and nutrient exchange of the microcirculation network, eliminating fatigue harmful substances and lactic acid accumulated around the eye, and relieving soreness; thus, in some examples, the display panel 100 may relieve eye fatigue and thus may enhance the user experience.

For example, the electric energy-thermal energy conversion rate of the electrostatic discharge layer 120 is larger than 99%. For example, the electrostatic discharge layer 120 may have excellent electrical conductivity, thereby ensuring that the electrostatic discharge layer 120 has a uniform temperature distribution (e.g., temperatures of the electrostatic discharge layer 120 are the same everywhere), and thus enabling the electrostatic discharge layer 120 to uniformly radiate infrared rays.

For example, in the cases where the voltages applied to the electrostatic discharge layer 120 are different, the phonons, the ions and the electrons generated by carbon molecules of graphene have different kinetic energies, and therefore the temperatures of the electrostatic discharge layer 120 respectively in these cases are different. As illustrated in FIGS. 7 and 9, in some examples, the display panel 100 further includes a temperature control circuit 152, and the temperature control circuit 152 is connected to the electrostatic discharge layer 120 and is configured to acquire temperature information of the electrostatic discharge layer 120 and control the voltage applied to the electrostatic discharge layer 120 by the voltage control circuit 151 according to the temperature information, thereby adjusting the temperature of the electrostatic discharge layer 120. For example, the temperature control circuit 152 may include a thermocouple circuit, an infrared detection circuit, or the like to detect the temperature of the electrostatic discharge layer 120, so that the temperature of the electrostatic discharge layer 120 can be maintained within the temperature range of 38° C.-42° C. by the temperature control circuit 152. For another example, the temperature of the electrostatic discharge layer 120 can be maintained at 40° C. by the temperature control circuit 152.

Figure 10:
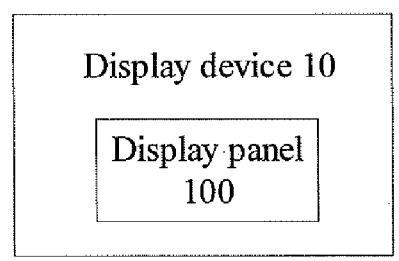
FIG. 10 is an exemplary block diagram of a display device provided by at least one embodiment of the present disclosure.

At least one embodiment of the present disclosure further provides a display device 10. As illustrated in FIG. 10, the display device 10 includes a display panel 100 provided by any one of the embodiments of the present disclosure. For example, the display device 10 may be implemented as a head-mounted display device which may be applied in virtual reality, augmented reality, and the like. By making the electrostatic discharge layer 120 include the lens unit 121, the thickness and the weight of the display device 10 can be reduced, and thus the user experience can be improved.

It should be noted that, other components (e.g., a thin film transistor, a control device, an image data encoding/decoding device, a row scan driver, a column scan driver, a clock circuit, etc.) of the display panel 100 and the display device 10 may adopt suitable components, this should be understood by those skilled in the art, no further descriptions will be given here and it should not be construed as a limitation on the embodiments of the present disclosure.

At least one embodiment of the present disclosure further provides a manufacturing method of the display panel, and the method comprises: providing a display laminated structure; and forming an electrostatic discharge layer on a surface, which is at a display side of the display laminated structure, of the display laminated structure. The display laminated structure comprises a display region, the electrostatic discharge layer comprises a lens unit, and the lens unit is on the display region.

Figure 11:
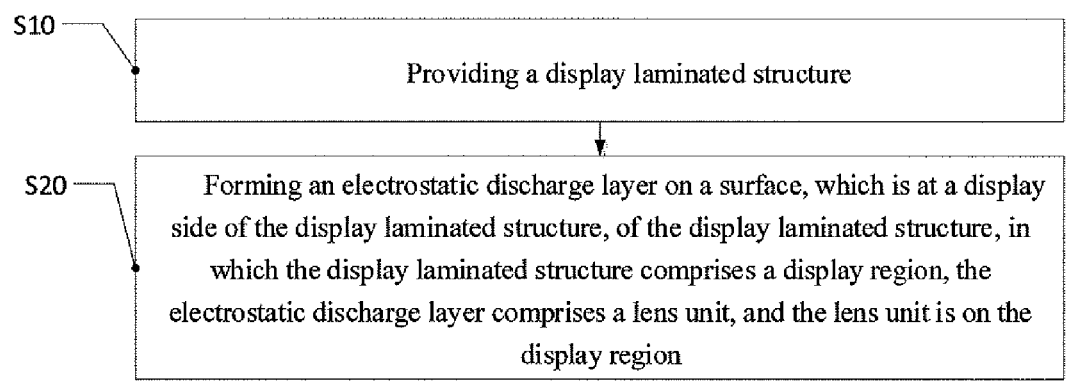
FIG. 11 is an exemplary flow chart of a manufacturing method of a display panel provided by at least one embodiment of the present disclosure.

FIG. 11 is an exemplary flow chart of a manufacturing method of a display panel provided by at least one embodiment of the present disclosure.

As illustrated in FIG. 11, the manufacturing method includes the following steps.

Step S10: providing a display laminated structure.

Step S20: forming an electrostatic discharge layer on a surface, which is at a display side of the display laminated structure, of the display laminated structure.

For example, the display laminated structure is configured as a liquid crystal display laminated structure or a self-luminous display laminated structure. The specific structure of the display laminated structure can refer to embodiments of the display panel and are not described here.

For example, the display laminated structure comprises a display region, the electrostatic discharge layer comprises a lens unit, and the lens unit is on the display region.

For example, the electrostatic discharge layer may be formed by adopting a suitable method such as a deposition method, an imprint method, a machining method or an etching method according to the transparent conductive material (e.g., ITO or graphene) that is specifically used to form the electrostatic discharge layer. For example, the graphene used may be prepared or purchased, and the method for preparing graphene can adopt existing related methods, and no limitation will be given in embodiments of the present disclosure in this respect. For example, specific process flow of the deposition method, the imprinting method, the machining method or the etching method may refer to relevant technologies, and are not described here.

In some examples, after the step S10 is executed and before executing the step S20, the method further includes thinning (performing thickness reduction on) the display laminated structure. For example, in the case where the display laminated structure is implemented as the liquid crystal display laminated structure and the electrostatic discharge layer is in direct contact with the color filter substrate, the display laminated structure can be thinned by thinning the thickness of the base substrate included in the color filter substrate. For example, in the case where the display laminated structure is realized as the self-luminous display laminated structure and the electrostatic discharge layer is in direct contact with the protective substrate, the display laminated structure can be thinned by thinning the thickness of the protective substrate.

In some examples, the manufacturing method may further include the following step S30.

Step S30: forming a planarization layer on a side surface of the electrostatic discharge layer away from the display laminated structure.

For example, the planarization layer may be formed of a transparent insulation material, and the planarization layer may be formed of an organic resin or an inorganic insulation material such as silicon oxide (SiOx), silicon oxynitride (SiNxOy), or silicon nitride (SiNx), for example.

For example, the electrostatic discharge layer includes the lens unit, so that the thickness and the weight of the display panel manufactured by the manufacturing method are reduced, and thus the user experience is improved.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. A display panel, comprising:
a display laminated structure, having a display side and a surface at the display side; and
an electrostatic discharge layer stacked on the surface of the display laminated structure,
wherein the display laminated structure comprises a display region on the surface of the display laminated structure, the electrostatic discharge layer comprises a lens unit, and the lens unit is on the display region;
wherein the lens unit is configured to converge light emitted by the display region of the display laminated structure.

2. The display panel according to claim 1, wherein the lens unit is made of a transparent conductive material.

3. The display panel according to claim 2, wherein the transparent conductive material comprises graphene.

4. The display panel according to claim 3, wherein the lens unit is a phase Fresnel lens.

5. The display panel according to claim 1, wherein the lens unit comprises a flat surface and a non-flat surface opposite to the flat surface; and the non-flat surface is further away from the display laminated structure than the flat surface.

6. The display panel according to claim 5, further comprising a planarization layer, wherein the planarization layer covers the non-flat surface, so as to planarize a surface, where the non-flat surface is provided, of the electrostatic discharge layer; and a refractive index of the planarization layer is smaller than a refractive index of the lens unit.

7. The display panel according to claim 1, further comprising a polarizer, wherein the polarizer is attached to a side of the electrostatic discharge layer away from the display laminated structure.

8. The display panel according to claim 1, wherein the display laminated structure comprises a plurality of display sub-pixels, and the lens unit corresponds to at least one display sub-pixel selected from a group consisting of the plurality of display sub-pixels.

9. The display panel according to claim 8, wherein the lens unit corresponds to the plurality of display sub-pixels.

10. The display panel according to claim 8, wherein the lens unit corresponds to a first number of display sub-pixels selected from the group consisting of the plurality of display sub-pixels; and the first number is larger than one and less than a number of the plurality of display sub-pixels.

11. The display panel according to claim 8, wherein the lens unit comprises a plurality of lens units and the electrostatic discharge layer comprises the plurality of lens units; and the plurality of lens units and the plurality of display sub-pixels are in one-to-one correspondence.

12. The display panel according to claim 11, wherein orthographic projections of the plurality of lens units on the display laminated structure respectively overlaps with the plurality of display sub-pixels.

13. The display panel according to claim 3, further comprising a voltage control circuit, wherein the voltage control circuit is connected to the electrostatic discharge layer and is configured to apply a voltage to the electrostatic discharge layer.

14. The display panel according to claim 13, further comprising a temperature control circuit, wherein the temperature control circuit is connected to the electrostatic discharge layer and is configured to acquire temperature information of the electrostatic discharge layer and control the voltage applied to the electrostatic discharge layer by the voltage control circuit according to the temperature information.

15. The display panel according to claim 14, wherein the temperature control circuit is configured to allow a temperature of the electrostatic discharge layer to be in a range of 38° C.-42° C. during an operation of the display panel.

16. The display panel according to claim 1, wherein the display laminated structure is configured as a liquid crystal display laminated structure or a self-luminous display laminated structure.

17. The display panel according to claim 16, wherein in a case where the display laminated structure is configured as the self-luminous display laminated structure, the self-luminous display laminated structure is an organic light emitting diode display laminated structure.

18. A display device, comprising the display panel according to claim 1.

19. The display device according to claim 18, wherein the display device is a head-mounted display device.

20. A manufacturing method of a display panel, comprising:

providing a display laminated structure, the display laminated structure having a display side and a surface at the display side; and forming an electrostatic discharge layer on the surface of the display laminated structure, wherein the display laminated structure comprises a display region on the surface of the display laminated structure, the electrostatic discharge layer comprises a lens unit, and the lens unit is on the display region, wherein the lens unit is configured to converge light emitted by the display region of the display laminated structure.

* * * * *